(12) United States Patent
Qian et al.

(10) Patent No.: US 11,706,987 B2
(45) Date of Patent: Jul. 18, 2023

(54) SEMICONDUCTOR DEVICE AND METHOD OF FORMING A SEMICONDUCTOR DEVICE

(71) Applicant: GLOBALFOUNDRIES Singapore Pte. Ltd., Singapore (SG)

(72) Inventors: You Qian, Singapore (SG); Joan Josep Giner De Haro, Singapore (SG); Rakesh Kumar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 660 days.

(21) Appl. No.: 16/722,137

(22) Filed: Dec. 20, 2019

(65) Prior Publication Data

US 2021/0193906 A1 Jun. 24, 2021

(51) Int. Cl.
| | | |
|---|---|---|
| *H01L 41/314* | (2013.01) | |
| *H10N 30/072* | (2023.01) | |
| *H10N 30/074* | (2023.01) | |
| *H10N 30/85* | (2023.01) | |
| *H10N 30/87* | (2023.01) | |

(52) U.S. Cl.
CPC ......... *H10N 30/072* (2023.02); *H10N 30/074* (2023.02); *H10N 30/85* (2023.02); *H10N 30/87* (2023.02)

(58) Field of Classification Search
None
See application file for complete search history.

(56) References Cited

U.S. PATENT DOCUMENTS

| | | | |
|---|---|---|---|
| 7,378,922 B2 | 5/2008 | Kubo et al. | |
| 7,586,239 B1 | 9/2009 | Li et al. | |
| 8,536,665 B2 | 9/2013 | Peng et al. | |
| 8,766,512 B2 | 7/2014 | Chen et al. | |
| 9,673,384 B2 | 6/2017 | Shealy | |
| 9,917,568 B2 | 3/2018 | Shealy | |
| 2011/0187227 A1* | 8/2011 | Chen | H03H 9/02535 29/25.35 |
| 2015/0137285 A1* | 5/2015 | Shim | B81C 1/00301 257/416 |
| 2015/0165479 A1* | 6/2015 | Lasiter | B06B 1/0666 29/25.35 |
| 2016/0087186 A1* | 3/2016 | Burak | H03H 9/173 310/366 |
| 2017/0264256 A1* | 9/2017 | Gibb | H03H 3/02 |
| 2017/0313577 A1 | 11/2017 | Pineda et al. | |

(Continued)

*Primary Examiner* — Benjamin P Sandvik
(74) *Attorney, Agent, or Firm* — Viering Jentschura & Partner MBB

(57) ABSTRACT

A semiconductor device may include: a substrate wafer, a bonding layer at least partially covering a front surface of the substrate wafer, a plurality of silicon pillars bonded to the front surface of the substrate wafer by the bonding layer, a single-crystal piezoelectric film having a first surface and an opposing second surface, a top electrode arranged adjacent to the first surface of the single-crystal piezoelectric film, and a bottom electrode arranged adjacent to the second surface of the single-crystal piezoelectric film. The single-crystal piezoelectric film may be supported by the plurality of silicon pillars such that the second surface of the piezoelectric film and the front surface of the substrate wafer enclose a cavity therebetween.

19 Claims, 9 Drawing Sheets

(56) References Cited

U.S. PATENT DOCUMENTS

2018/0054176 A1\* 2/2018 Kim ...................... H03H 9/547
2018/0138885 A1\* 5/2018 Stokes .................. H03H 9/132
2018/0358948 A1   12/2018 Gong et al.
2020/0189909 A1    6/2020 Qian et al.
2021/0193899 A1\*  6/2021 Qian ................... H10N 30/067

\* cited by examiner

802 — at least partially covering a front surface of a substrate wafer with a bonding layer;

804 — providing a second wafer comprising a single-crystal piezoelectric film having a first surface and an opposing second surface, a plurality of silicon pillars arranged over the second surface of the single-crystal piezoelectric film, and a bottom electrode arranged on the second surface of the single-crystal piezoelectric film;

806 — bonding the second wafer to the substrate wafer such that the plurality of silicon pillars are bonded to the front surface of the substrate wafer with the bonding layer and a cavity is enclosed between the second surface of the piezoelectric film and the front surface of the substrate wafer; and 808 — providing a top electrode adjacent to the first surface of the single-crystal piezoelectric film.

FIG. 8

SEMICONDUCTOR DEVICE AND METHOD OF FORMING A SEMICONDUCTOR DEVICE

TECHNICAL FIELD

Various embodiments relate to semiconductor devices and methods of forming a semiconductor device. The semiconductor devices may be resonators or transducers.

BACKGROUND

There is an increasing need for materials with high piezoelectric coefficient, for applications such as 5G communication devices and ultrasonic transducer devices. 5G communication devices require radiofrequency filters and resonators capable of achieving high bandwidth and selectivity in the sub 6 GHz frequency band. Ultrasonic transducer devices have important applications in medical and biometric fields, for example, medical imaging. In these ultrasonic transducer applications, it is a challenge to achieve sufficient axial resolution. Existing solutions include applying signal processing techniques, or building arrays that include transducers of different operating frequencies.

SUMMARY

According to various embodiments, there may be provided a semiconductor device. The semiconductor device may include: a substrate wafer, a bonding layer at least partially covering a front surface of the substrate wafer, a plurality of silicon pillars bonded to the front surface of the substrate wafer by the bonding layer, a single-crystal piezoelectric film having a first surface and an opposing second surface, a top electrode arranged adjacent to the first surface of the single-crystal piezoelectric film, and a bottom electrode arranged adjacent to the second surface of the single-crystal piezoelectric film. The single-crystal piezoelectric film may be supported by the plurality of silicon pillars such that the second surface of the piezoelectric film and the front surface of the substrate wafer enclose a cavity therebetween.

According to various embodiments, there may be provided a method of forming a semiconductor device. The method may include: at least partially covering a front surface of a substrate wafer with a bonding layer, providing a second wafer, bonding the second wafer to the substrate wafer, and providing a top electrode adjacent to a first surface of a single-crystal piezoelectric film. The second wafer may include the single-crystal piezoelectric film, a plurality of silicon pillars, and a bottom electrode. The single-crystal piezoelectric film may have the first surface and an opposing second surface. The plurality of silicon pillars may be arranged over the second surface of the single-crystal piezoelectric film. The bottom electrode may be arranged on the second surface of the single-crystal piezoelectric film. The plurality of silicon pillars may be bonded to the front surface of the substrate wafer with the bonding layer and a cavity may be enclosed between the second surface of the piezoelectric film and the front surface of the substrate wafer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 8 shows a flow diagram of a method for forming a semiconductor device according to various non-limiting embodiments.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

In order that the invention may be readily understood and put into practical effect, various embodiments will now be described by way of examples and not limitations, and with reference to the figures.

According to various non-limiting embodiments, a semiconductor device may include a thin film of single-crystal piezoelectric material bonded to a Complementary Metal-Oxide-Semiconductor (CMOS) wafer or other types of active substrates. The semiconductor device may include a top electrode and a bottom electrode patterned onto opposing sides of the thin film of single-crystal piezoelectric material. The starting material for fabricating the semiconductor device may be a piezoelectric-on-insulator (POI) wafer with tight thickness control and uniformity. Using the POI wafer as a starting material may allow the thin film of piezoelectric material to be transferred onto another substrate, such as a CMOS wafer, before the device features are fabricated onto the piezoelectric material. It also opens up the possibility for new materials with large coupling coefficient $K_t^2$, such as lithium niobate, to be used as the piezoelectric material. Owing to the large $K_t^2$ of lithium niobate, the semiconductor device may include multiple resonators or transducers on one chip that operate at a plurality of frequencies. For example, lithium niobate has a higher coupling coefficient than aluminum nitride, a commonly used piezoelectric material in fabricating resonator and transducer devices. The $K_t^2$ of lithium niobate is about 47.6%, as compared to about 1% for aluminum nitride. A single-crystal piezoelectric material may offer the advantage of high quality factor, for example, larger than 3000, and increased power handling capability. The quality of the thin film may be also be maintained even when the thickness is reduced. The single-crystal piezoelectric thin film also has a high piezoelectric coefficient such that large mechanical and electrical bandwidths may be achieved, leading to a narrow pulse duration which results in a high axial resolution for ultrasonic diagnostic devices.

Figure 1A:
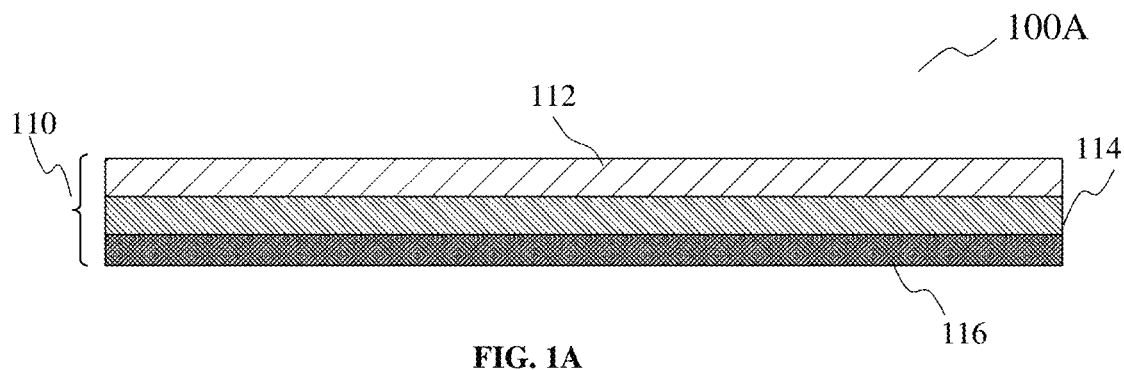
FIGS. 1A to 1L show a method of forming a semiconductor device according to various non-limiting embodiments.

FIGS. 1A to 1L show a method of forming a semiconductor device 102 according to various non-limiting embodiments. FIG. 1A shows a process 100A. In the process 100, a piezoelectric-on-insulator (POI) wafer 110 may be provided. The POI wafer 110 may include a piezoelectric layer 112, an insulator layer 114 and a substrate layer 116. The piezoelectric layer 112 may include a single piezoelectric crystal. The insulator layer 114 may serve to electrically insulate the piezoelectric layer 112 from the substrate layer 116. The insulator layer 114 may include an oxide, such as silicon dioxide. The substrate layer 116 may include a semiconductor material, such as silicon. Other types of material composition for the insulator layer 114 and the substrate layer 116 are acceptable, as these two layers will be subsequently removed.

Figure 1B:
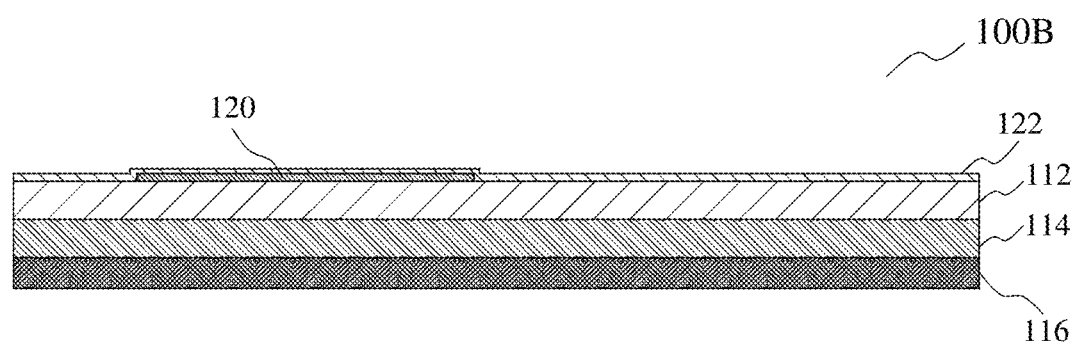

FIG. 1B shows a process 100B. In the process 100B, a bottom electrode 120 may be formed. The process 100B may also include forming a bottom passivation layer 122. The electrode and passivation layer will be on a bottom surface of the piezoelectric layer 112 when the POI wafer 110 is flipped around and bonded to another wafer. Forming the bottom electrode 120 may include depositing a metal layer onto the piezoelectric layer 112, then patterning the metal layer using a first mask to form the bottom electrode 120. The metal layer may include molybdenum. Forming the bottom passivation layer 122 may include depositing a layer of etch-resistant material. The etch-resistant material may be resistant to etching by an etchant for silicon, such as sulfur hexafluoride ($SF_6$). The etch-resistant material include aluminum nitride (AlN), aluminum oxide ($Al_2O_3$), or combinations thereof.

Figure 1C:
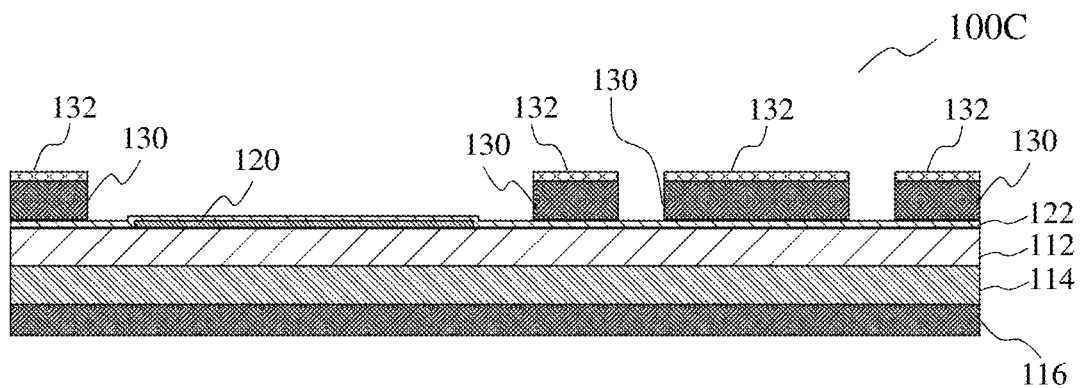

FIG. 1C shows a process 100C. The process 100C may include forming stand-off structures, also referred herein as silicon pillars 130. Forming the silicon pillars 130 may include depositing a silicon layer onto the bottom passivation layer 122. The process 100C may further include depositing a barrier material (not shown in the figure) over the silicon layer, before depositing a first bonding metal 132 over the silicon layer. The barrier material may prevent eutectic reaction or mixing of the silicon pillar 130 with the first bonding metal 132. The barrier material may include titanium. The first bonding metal 132 may include germanium (Ge). The silicon layer, the barrier material and the first bonding metal 132 may be etched using a second mask. The etching process may be carried out using an etchant which does not react with the bottom passivation layer 122. For example, the etchant may include $SF_6$. The bottom passivation layer 122 may protect the bottom electrode 120 from being etched away, during the formation of the silicon pillars 130. The etching process may include deep reactive-ion etching (DRIE), which is a highly anisotropic etch process, so as to create steep side walls on the silicon pillars 130. The DRIE process may offer precise control of ±0.1° over the angle of side walls of the silicon pillars 130, as well as precise control over dimensions of ±50 nm. The side walls of the silicon pillars 130 may be at least substantially vertical. The side walls of the silicon pillars 130 may be at least substantially perpendicular, for example, 90°±0.1°, relative to the POI wafer 110 and also at least substantially perpendicular to a substrate wafer 140 that it is subsequently bonded to. After the etching process, a plurality of silicon pillars 130 coated with the barrier material and the first bonding metal 132 remain. These silicon pillars 130 may subsequently serve to support a vibration member which includes the bottom electrode 120, a top electrode and a region of the piezoelectric layer 112 that lies between the bottom electrode 120 and the top electrode. As such, the silicon pillars 130 may be arranged laterally offset from the bottom electrode 120 so as not to obstruct movements of the vibration member. The dimension of the lateral offset may define device critical parameters, such as vibrating frequency range and quality factor. In other words, the dimension of the lateral offset may be selected to meet the desired characteristics of the semiconductor device.

Figure 1D:
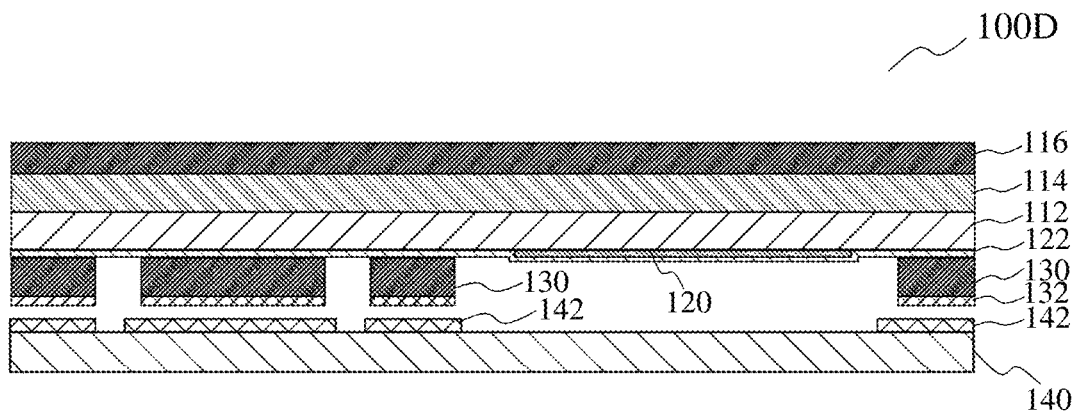

FIG. 1D shows a process 100D. The process 100D may include providing a substrate wafer 140, flipping the POI wafer 110 from the process 100C and arranging the flipped POI wafer 110 over the substrate 140 as shown. The substrate wafer 140 may be a CMOS wafer, or may be a bare silicon wafer, or may be any other types of suitable wafers. A second bonding metal 142 may be deposited onto the substrate wafer 140. The second bonding metal 142 may be patterned to align with the first bonding metal 132 when the POI wafer 110 is flipped onto the substrate wafer 140. The second bonding metal 142 may include a metal that may form a eutectic alloy with the first bonding metal 132. For example, the second bonding metal 142 may include aluminum (Al) which may form an alloy with the Ge in the first bonding metal 132. By this process, the device that is eventually fabricated in the POI wafer 110 may be integrated with a CMOS wafer or other types of external circuit housed in the substrate wafer 140, without extra cost.

Figure 1E:
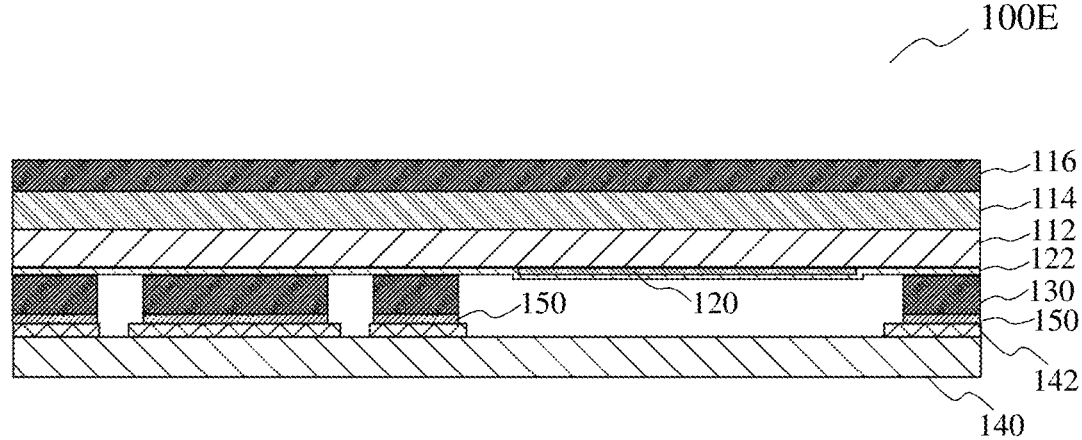

FIG. 1E shows a process 100E. The process 100E may include bonding the POI wafer 110 to the substrate wafer 140 shown in process 100D. Eutectic bonding of the first bonding metal 132 to the second bonding metal 142 may form a bonding layer 150. The bonding process may take place at around 450 degrees Celsius. The bonding layer 150 may include an alloy of the first bonding metal 132 and the second bonding metal 142, such as Al/Ge. Part of the second bonding metal 142 may remain uncombined with the first bonding metal 132, and may subsequently form part of an interconnect layer.

Figure 1F:
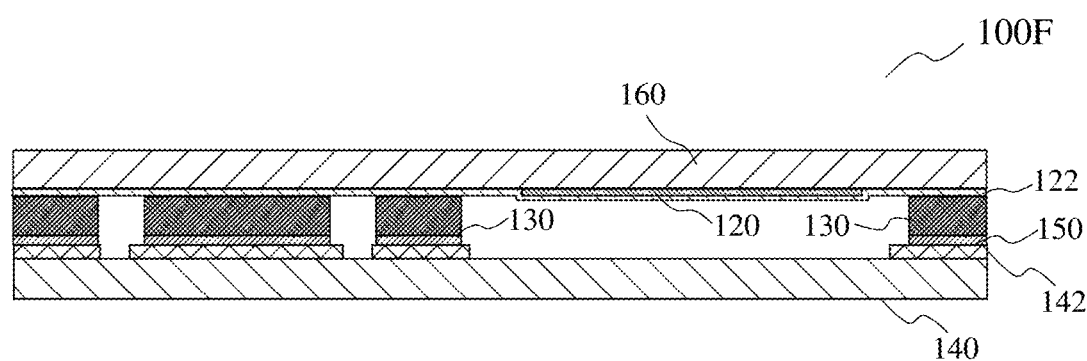

FIG. 1F shows a process 100F. The process 100F may include removing the insulator layer 114 and the substrate layer 116 of the POI wafer 110, such that only the piezoelectric layer 112 of the initial POI wafer 110 remains. The substrate layer 116 may first be removed by a combination of grinding and etching. Next, the now exposed insulator layer 114 may be removed by etching, for example, using vapor hydrofluoric acid (VHF) etching or wet etching. The piezoelectric layer 112 may be further grinded or etched to reduce the thickness of the piezoelectric layer 112. The piezoelectric layer 112, or the reduced thickness piezoelectric layer, may be referred hereafter as a piezoelectric film 160.

Figure 1G:
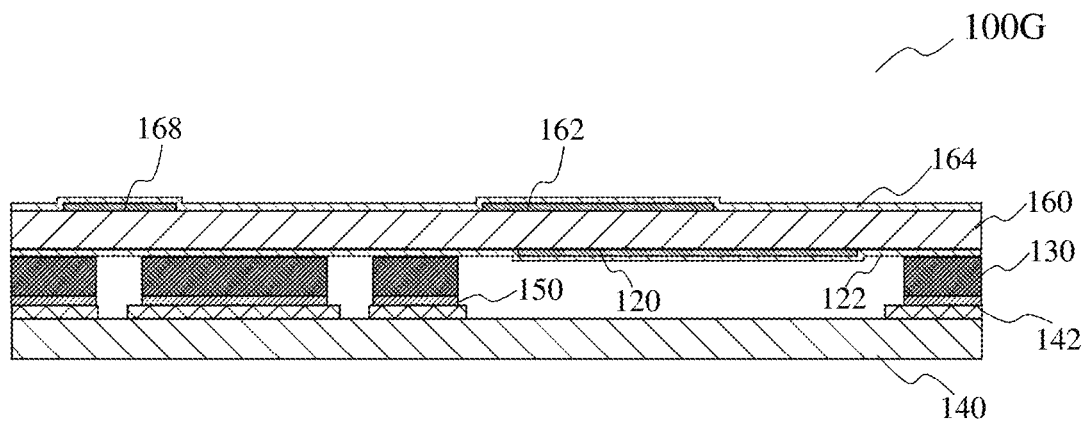

FIG. 1G shows a process 100G. The process 100G may include forming a top electrode 162 on the piezoelectric film 160. Forming the top electrode 162 may including depositing a metal layer over the piezoelectric film 160 and then patterning the deposited metal layer using a third mask, similar to the process of forming the bottom electrode 120. The process 100G may also include forming a top passivation layer 164. The process of forming the top passivation layer 164 may be similar to the process of forming the bottom passivation layer 122. The top electrode 162 may have the same material composition as the bottom electrode 120. The top passivation layer 164 may have the same material composition as the bottom passivation layer 122. In the same process as forming the top electrode 162, a top electrical pad 168 may be formed using the third mask. The top electrical pad 168 may be connected to the top electrode 162 and may serve as an electrical contact point for external devices to connect to the top electrode 162.

Figure 1H:
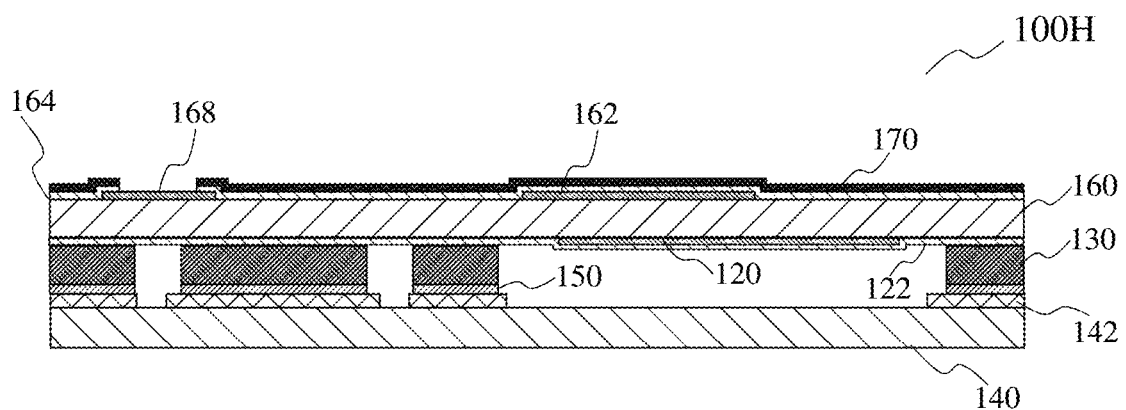

FIG. 1H shows a process 100H. The process 100H may include adding an etch buffer layer 170. The etch buffer layer 170 may include a dielectric material, for example silicon dioxide. The process 100H may further include etching a region of the etch buffer layer 170 and the top passivation layer 164 that overlaps with the top electrical pad 168 using a fourth mask, so as to expose a top surface of the top electrical pad 168. The etch buffer layer 170 may prevent the top passivation layer 164 from being etched in the process 100K, as will be described with respect to FIG. 1K.

Figure 1I:
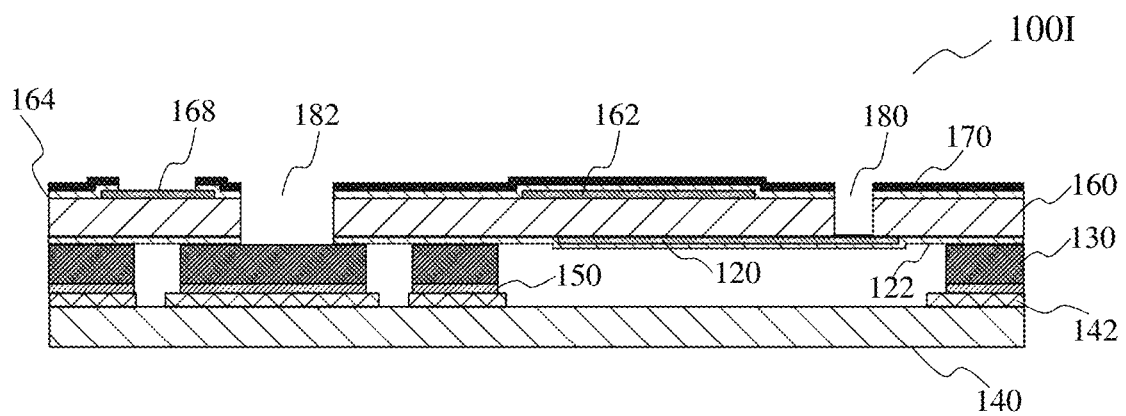

FIG. 1I shows a process 100I. The process 100I may include forming a first via 180 that reaches the bottom electrode 120. The process 100I may also include forming a second via 182 that reaches one of the silicon pillars 130. Forming the first via 180 and the second via 182 may include etching the etch buffer layer 170, the top passivation layer 164, the piezoelectric film 160, and the bottom passivation layer 122, using a fifth mask.

Figure 1J:
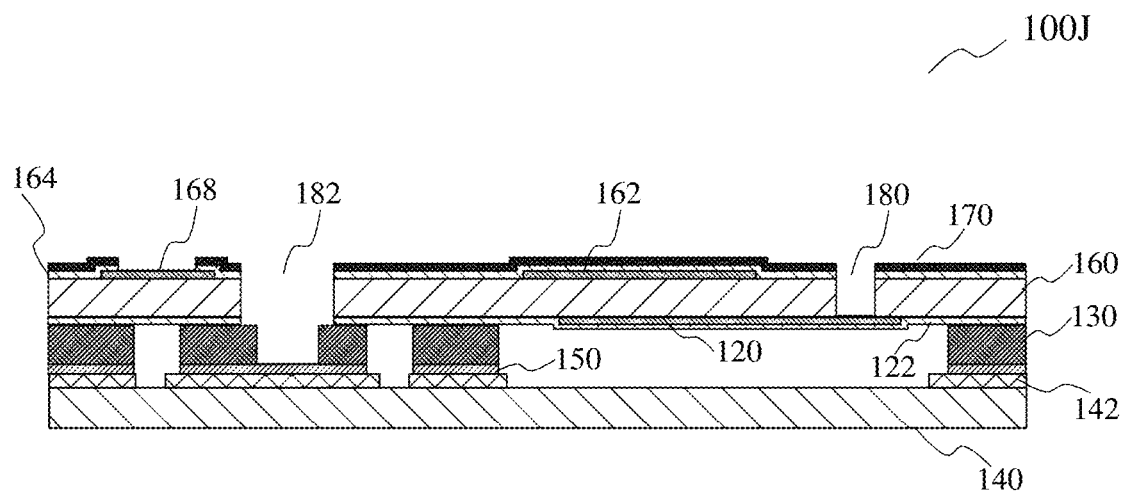

FIG. 1J shows a process 100J. The process 100J may include deepening the second via 182 so that it reaches to the bonding layer 150. Deepening the second via 182 may include etching the silicon pillar 130 under the second via 182, using a sixth mask.

Figure 1K:
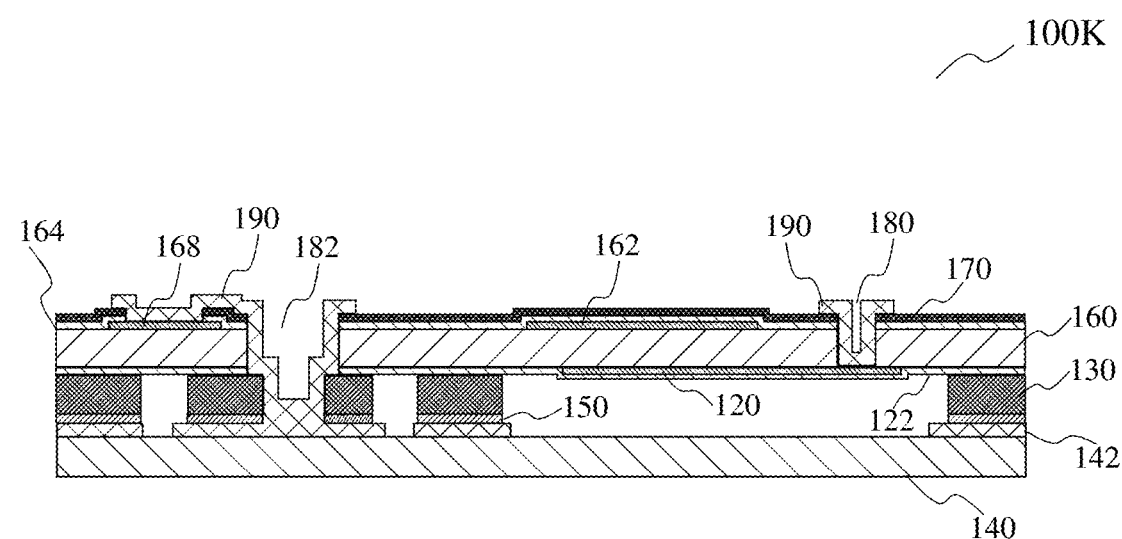

FIG. 1K shows a process 100K. The process 100K may include forming an interconnect member 190. Forming the interconnect member 190 may include depositing an electrical conductor material over the semiconductor device from the process 100I and then etching the electrical conductor material using a seventh mask. The electrical conductor material may have the same material composition as the bonding layer 150. The interconnect member 190 may extend into the first via 180 and the second via 182, and may line the sidewalls of the vias. The etch buffer layer 170 may protect the top passivation layer 164 from being etched during the process of etching the electrical conductor material to form the interconnect member 190. In other words, the etch buffer layer 170 may serve as a sacrificial layer for the process of etching the electrical conductor material to form the interconnect member 190.

Figure 1L:
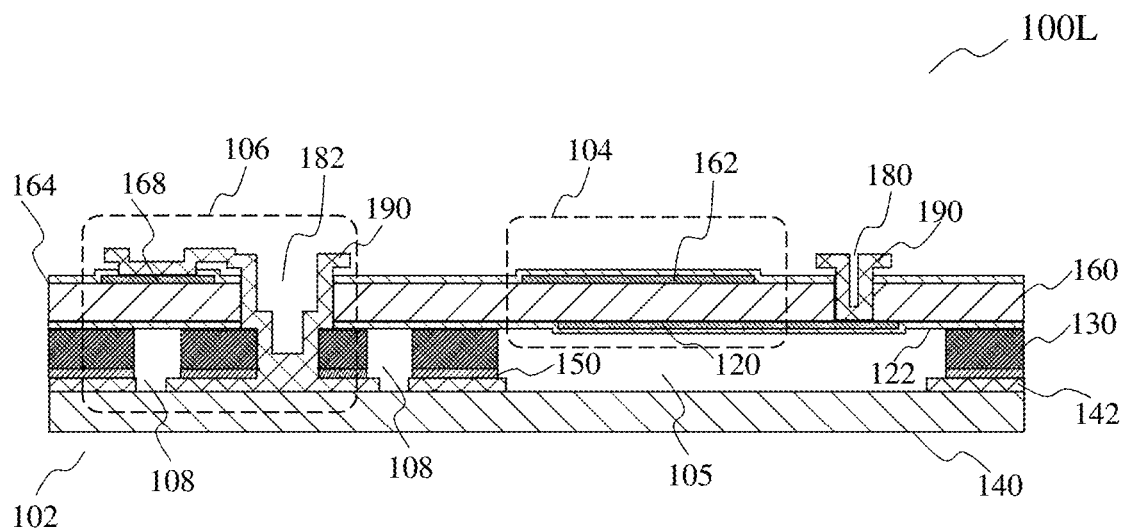

FIG. 1L shows a process 100L. The process 100L may include removing the etch buffer layer 170, for example, by using an etchant.

Figure 2:
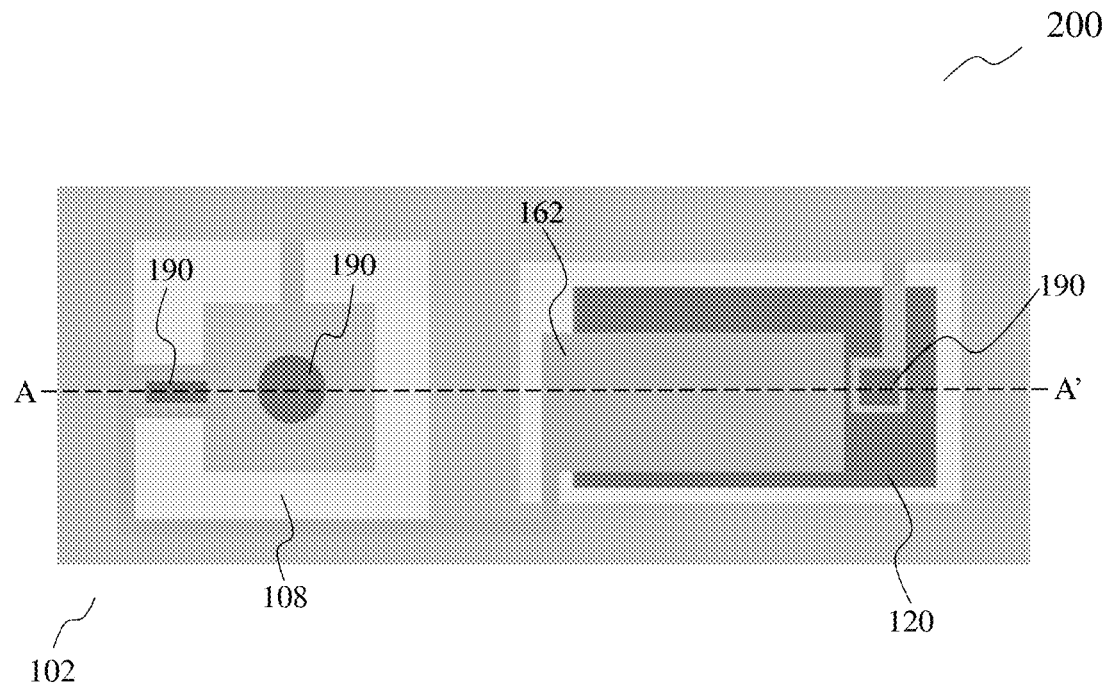
FIG. 2 shows a top view of the semiconductor device of FIG. 1L.

FIG. 2 shows a top view 200 of the semiconductor device 102 according to various non-limiting embodiments. FIG. 1L also shows a cross-sectional view of the semiconductor device 102 when the semiconductor device 102 is cut along the line AA'. The semiconductor device 102 may include a resonator device. The semiconductor device 102 may include a resonator region 104 and a contact region 106. The resonator region 104 may include the top electrode 162, the bottom electrode 120 and a portion of the piezoelectric film 160 arranged between these electrodes. The contact region 106 may include the interconnect member 190, the top electrical pad 168, a region of the bonding layer 150 underlying the second via 182, and a region of the second bonding metal 142 underlying the second via 182. The silicon pillars 130 may support the piezoelectric film 160 over a cavity 105 between the piezoelectric film 160 and the substrate wafer 140. The silicon pillars may provide a precise boundary for the resonator region 104, owing to the precise angles at which silicon may be etched. There may be one or more air gaps 108 between every two adjacent silicon pillars 130. The air gaps 108 are empty spaces that electrically insulate the adjacent silicon pillars.

Figure 3A:
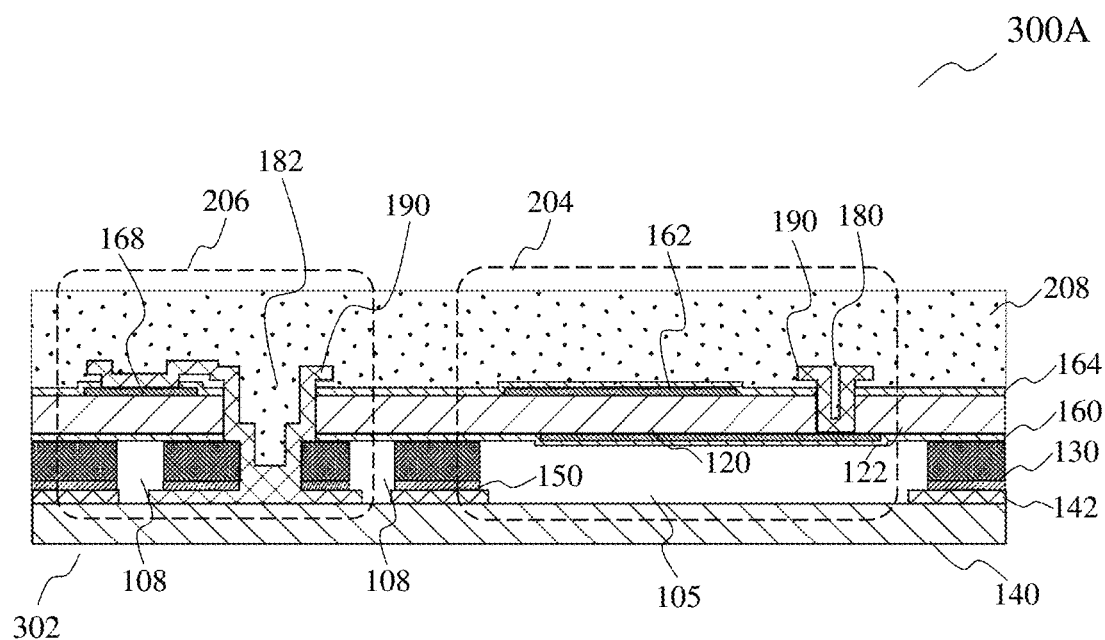
FIG. 3A shows a process, as well as a cross-sectional view of a semiconductor device according to various non-limiting embodiments.
Figure 3B:
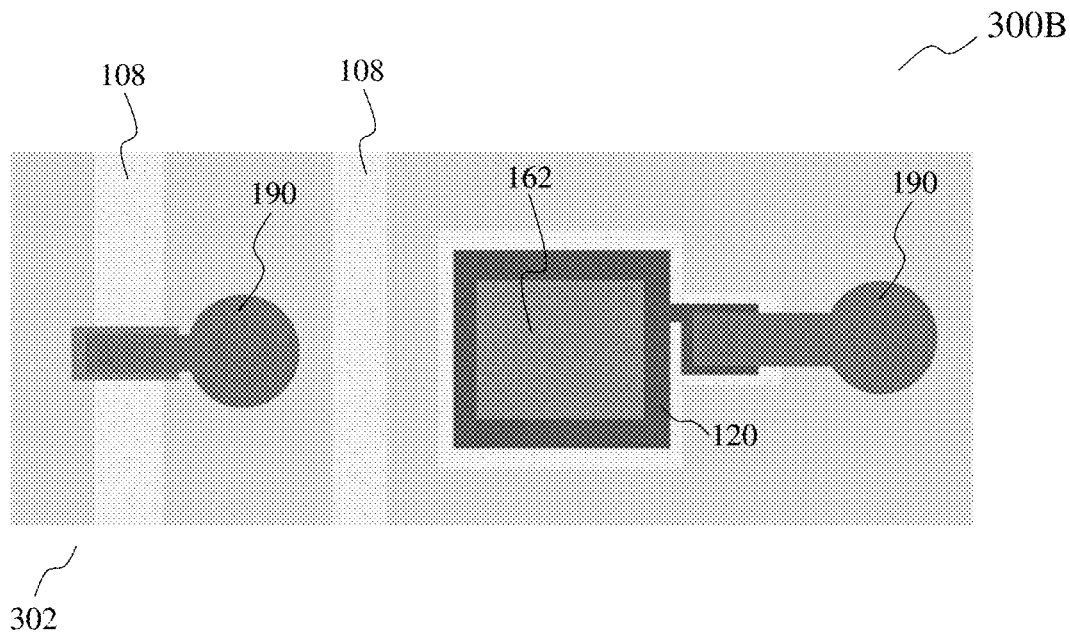
FIG. 3B shows a top view of the semiconductor device of FIG. 3A.

FIG. 3A shows a process 300A, as well as a cross-sectional view of a semiconductor device 302 according to various non-limiting embodiments. FIG. 3B shows a top view 300B of the semiconductor device 302. The process 300A may include depositing an elastic layer 208 over the semiconductor device 102. The elastic layer may include a polymer, such as polyimide. The semiconductor device 302 may include a transducer device, such as a piezoelectric micromachined ultrasonic transducer (PMUT). The semiconductor device 302 may include a transducer region 204 and a contact region 206. Following the deposition of the elastic layer 208, the elastic layer 208 may be etched, so as to provide access to at least one of the underlying top electrical contact pad 168, the first via 180 and the second via 182.

Figure 4A:
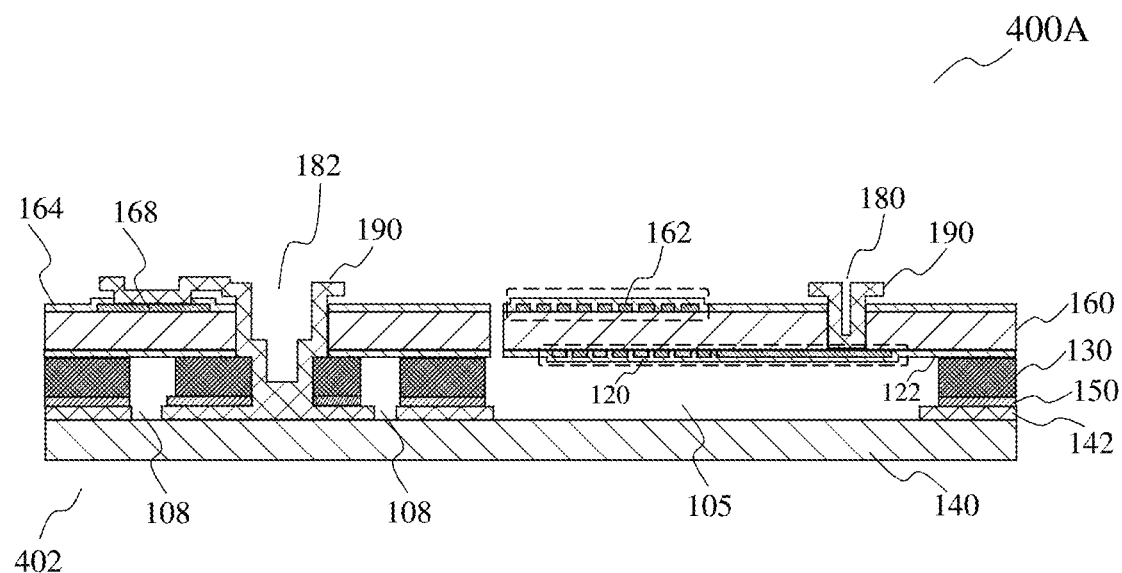
FIG. 4A show a cross-sectional view of a semiconductor device according to various non-limiting embodiments.
Figure 4B:
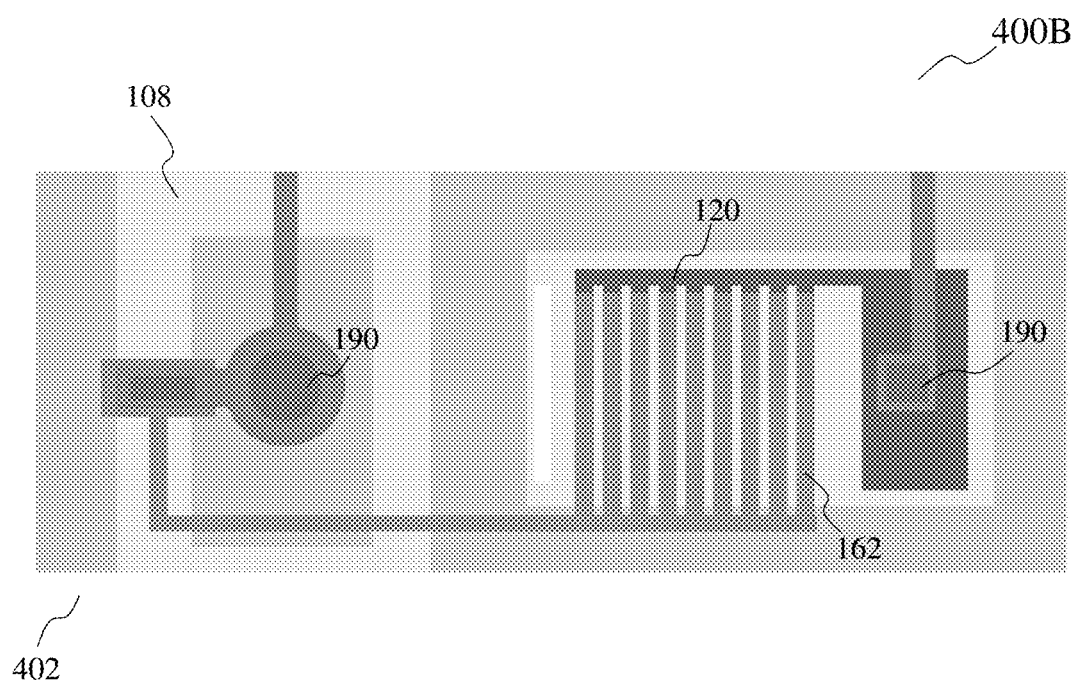
FIG. 4B shows a top view of the semiconductor device of FIG. 4A.

FIG. 4A and FIG. 4B show a cross-sectional view 400A and a top view 400B of a semiconductor device 402 according to various non-limiting embodiments, respectively. The semiconductor device 402 may include a resonator device like the semiconductor device 102, but may differ from the semiconductor device 102 in that each of the top electrode 162 and the bottom electrode 120 have at least one slit therein. In the fabrication process of the semiconductor device 402, the top electrode 162 and the bottom electrode 120 may be etched to create the slits. In the semiconductor device 402, the top electrode 162 and the bottom electrode 120 may each have finger members. The finger members of the top electrode 162 and the finger members of the bottom electrode 120 may overlap. The semiconductor device 402 may include a lamb wave resonator. The air gaps 108 may provide acoustic boundary in the resonator.

Figure 5:
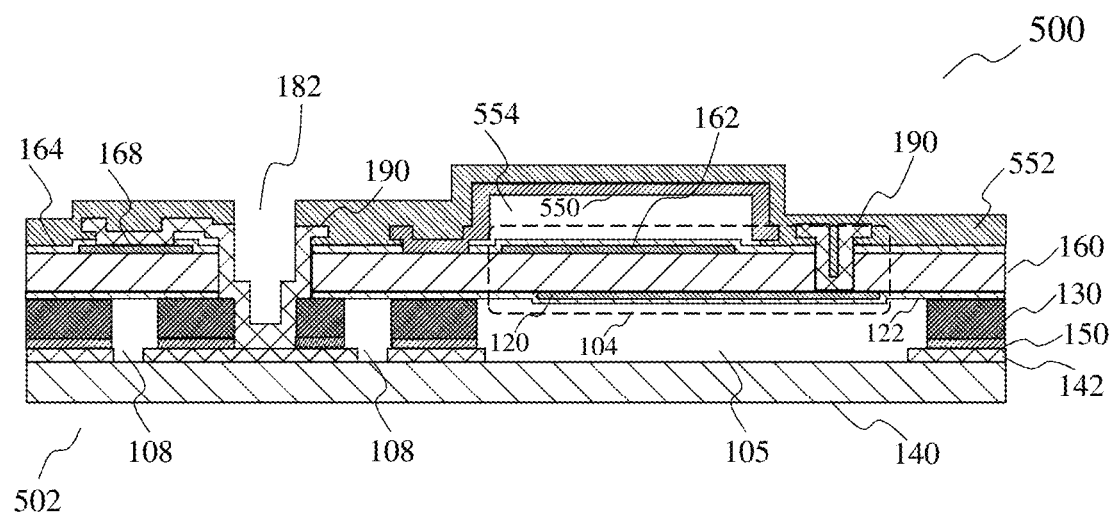
FIG. 5 shows a cross-sectional view of a semiconductor device according to various non-limiting embodiments.

FIG. 5 shows a cross-sectional view 500 of a semiconductor device 502 according to various non-limiting embodiments. The semiconductor device 502 may include a resonator device like the semiconductor device 102, but may differ from the semiconductor device 102 in that it includes wafer level encapsulation. The wafer level encapsulation may include integrated shielding from electromagnetic interference. The semiconductor device 502 may include a metal cap 550 that may be at least partially anchored to the piezoelectric film 160, or the top passivation layer 164. At least one point between the metal cap 550 and the piezoelectric film 160 or the top passivation layer 164 may be unanchored. The metal cap 550 may at least substantially extend over the resonator region 104. The metal cap 550 may at least partially extend over at least one of the top electrode 162 and the bottom electrode 120. The semiconductor device 502 may further include a sealing layer 552 disposed over the metal cap 550 and the single-crystal piezoelectric film 160 such that the sealing layer 552 seals a gap between the unanchored portion of the metal cap 550 and the single-crystal piezoelectric film 160 or the top passivation layer 164, to encapsulate the resonator region 104. The metal cap 550 and the bonding layer 150 may include the same material composition. The metal cap 550 may enclose an upper cavity 554 over the resonator region 104.

Figure 6:
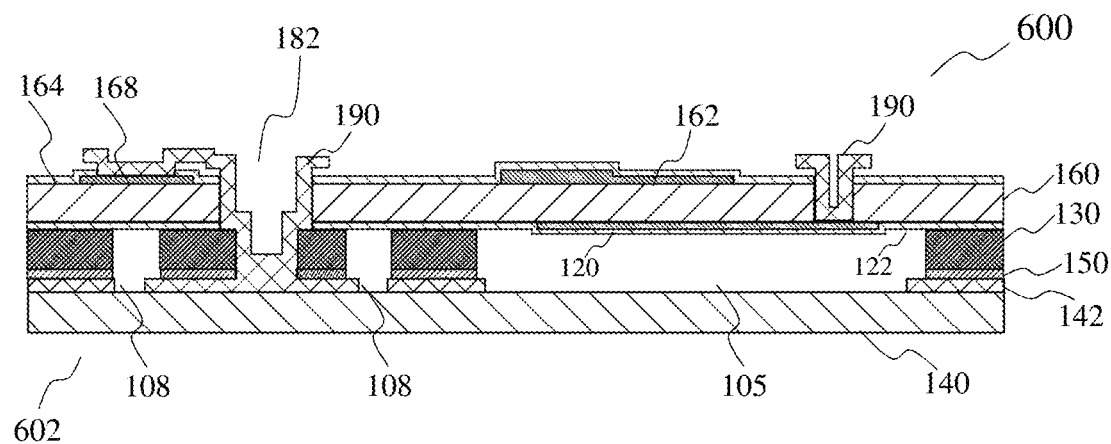
FIG. 6 shows a cross-sectional view of a semiconductor device according to various non-limiting embodiments.

FIG. 6 shows a cross-sectional view 600 of a semiconductor device 602 according to various non-limiting embodiments. The semiconductor device 602 may include a resonator device like the semiconductor device 102, but may differ from the semiconductor device 102 in that at least one of the top electrode 162 and the bottom electrode 120 may include segments of different thicknesses. For example, an additional layer of metal may be deposited during the fabrication of the top electrode 162, such that the top electrode 162 has a stepped structure. By having segments of different thicknesses in the electrodes, the resonator region may operate in more than one frequency band.

Figure 7:
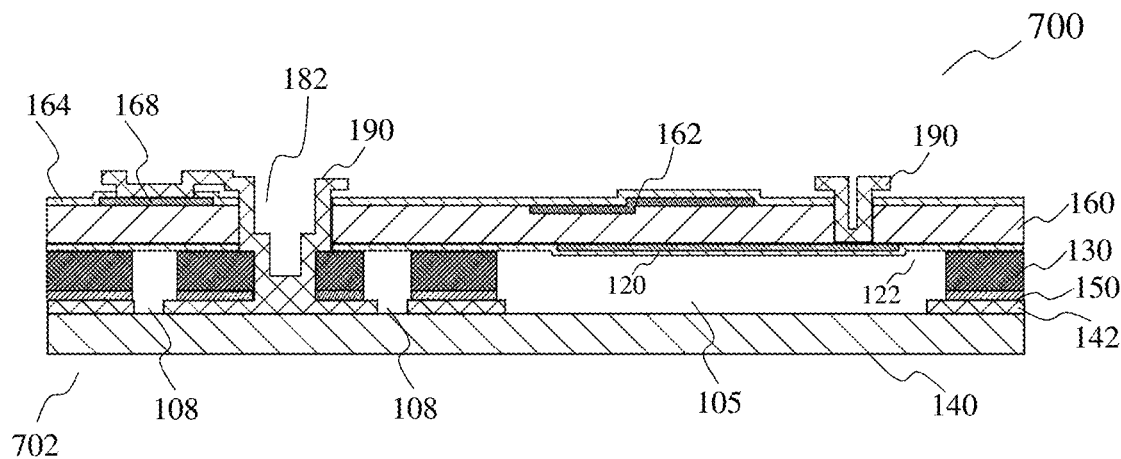
FIG. 7 shows a cross-sectional view of a semiconductor device according to various non-limiting embodiments.

FIG. 7 shows a cross-sectional view 700 of a semiconductor device 702 according to various non-limiting embodiments. The semiconductor device 702 may include a resonator device like the semiconductor device 102, but may differ from the semiconductor device 102 in that the single-crystal piezoelectric film 160 may include segments of different thicknesses. The piezoelectric film 160 may be partially etched to create depressions where the top electrode 162 may be partially formed. By having segments of different thicknesses in the piezoelectric film 160, the resonator region may operate in more than one frequency band.

According to various non-limiting embodiments, an elastic layer may be provided, like in the process 300A, over any one of the semiconductor devices 402, 602, and 702, to form a PMUT device.

According to various non-limiting embodiments, a semiconductor device may be provided. The semiconductor device may be any one of the semiconductor devices 102, 302, 402, 502, 602 and 702. The semiconductor device may include a substrate wafer, such as the substrate wafer 140. The semiconductor device may include a bonding layer at least partially covering a front surface of the substrate wafer. The bonding layer may include the bonding layer 150. The bonding layer may additionally include the second bonding metal 142. The bonding layer may include at least one of aluminum, germanium, or combinations thereof. The semiconductor device may include a plurality of silicon pillars bonded to the front surface of the substrate wafer by the bonding layer. The silicon pillars may include the silicon pillars 130. Each silicon pillar may have side walls that are perpendicular to the front surface of the substrate wafer. The semiconductor device may include a single-crystal piezoelectric film, such as the piezoelectric film 160 or the piezoelectric layer 112. The single-crystal piezoelectric film may have a first surface and an opposing second surface, wherein the single-crystal piezoelectric film is supported by the plurality of silicon pillars such that the second surface of the piezoelectric film and the front surface of the substrate wafer enclose a cavity therebetween. Each silicon pillar may be electrically isolated from adjacent silicon pillars by one or more air gaps. The semiconductor device may include a top electrode arranged adjacent to the first surface of the single-crystal piezoelectric film, and a bottom electrode arranged adjacent to the second surface of the single-crystal piezoelectric film. The top electrode may be the top electrode 162. The bottom electrode may be the bottom electrode 120. The semiconductor device may further include a top passivation layer arranged adjacent to the first surface of the single-crystal piezoelectric film and enclosing the top electrode therein, and a bottom passivation layer arranged adjacent to the second surface of the single-crystal piezoelectric film and enclosing the bottom electrode therein. The top passivation layer may include the top passivation layer 164. The bottom passivation layer may include the bottom passivation layer 122. Each of the top passivation layer and the bottom passivation layer may include a material that is resistant to etching by $SF_6$. The semiconductor device may further include an interconnect member at least partially arranged over the first surface of the single-crystal piezoelectric film and extending down through a via in the single-crystal piezoelectric film to reaching the bonding layer. The interconnect member may be the interconnect member 190. The interconnect member and the bonding layer may include the same material composition.

According to various non-limiting embodiments, each of the top electrode and the bottom electrode includes a plurality of finger members, for example like in the semiconductor device 402. The plurality of finger members of the top electrode may at least substantially overlap with the plurality of finger members of the bottom electrode.

According to various non-limiting embodiments, the semiconductor device may further include a metal cap at least partially anchored to the first surface of the single-crystal piezoelectric film where at least one point between the metal cap and the single-crystal piezoelectric film is unanchored, for example like in the semiconductor device 502. The metal cap may at least partially extend over at least one of the top electrode and the bottom electrode. The semiconductor device may further include a sealing layer disposed over the metal cap and the single-crystal piezoelectric film such that the sealing layer seals a gap between an unanchored portion of the metal cap and the single-crystal piezoelectric film. The metal cap and the bonding layer may include the same material composition.

According to various non-limiting embodiments, at least one of the top electrode and the bottom electrode may include segments of different thicknesses, like in the semiconductor device 602.

According to various non-limiting embodiments, the single-crystal piezoelectric film may include segments of different thicknesses, like in the semiconductor device 702.

According to various non-limiting embodiments, the semiconductor device may include an elastic layer arranged over the single-crystal piezoelectric film, like in the semiconductor device 302. The semiconductor device may include a PMUT.

According to various non-limiting embodiments, the semiconductor device may be part of a filter device, such as a radiofrequency filter device.

FIG. 8 shows a flow diagram 800 of a method for forming a semiconductor device according to various non-limiting embodiments. The semiconductor device may be any one of the semiconductor devices 102, 302, 402, 502, 602 and 702. The method may include at least partially covering a front surface of a substrate wafer with a bonding layer, in 802. 802 may include the process 100D. The substrate wafer may be the substrate wafer 140. The bonding layer may include the second bonding metal 142. The method may include providing a second wafer, in 804. The second wafer may include a single-crystal piezoelectric film having a first surface and an opposing second surface, a plurality of silicon pillars arranged over the second surface of the single-crystal piezoelectric film, and a bottom electrode arranged on the second surface of the single-crystal piezoelectric film. 804 may include the processes 100A to 100C. The single-crystal piezoelectric film may include the piezoelectric film 160 or the piezoelectric layer 112. The plurality of silicon pillars may include the silicon pillars 130. The bottom electrode may be the bottom electrode 120. The method may include bonding the second wafer to the substrate wafer such that the plurality of silicon pillars are bonded to the front surface of the substrate wafer with the bonding layer and a cavity is enclosed between the second surface of the piezoelectric film and the front surface of the substrate water, in 806. 806 may include the process 100E. The cavity may be the cavity 105. The method may include providing a top electrode adjacent to the first surface of the single-crystal piezoelectric film, in 808. 808 may include the process 100G. The top electrode may be the top electrode 162. Providing the second wafer in 804, may include providing a POI wafer, like in the process 100A. The POI wafer may be the POI wafer 110. The POI wafer may include the single-crystal piezoelectric film, an insulator layer and a substrate layer. Providing the second wafer may further include depositing a first metal layer on the second surface of the single-crystal piezoelectric film, and patterning the first metal layer to form the bottom electrode, like in the process 100B. Providing the second wafer may further include depositing the plurality of silicon pillars over the second surface of the single-crystal piezoelectric film, like in the process 100C. In 808, providing the top electrode may include removing the insulator layer and the substrate layer after the second wafer is bonded to the substrate wafer, like in the process 100F. Removal of the insulator layer and the substrate layer may expose the first surface of the single-crystal piezoelectric film. Providing the top electrode may include depositing a second metal layer on the first surface of the single-crystal piezoelectric film, and patterning the second metal layer to form the top electrode.

The method may further include providing a first passivation layer over the first surface of the single-crystal piezoelectric film and the top electrode to enclose the top electrode, like in the process 100G. The first passivation layer may be the top passivation layer 164. The method may further include providing a second passivation layer over the second surface of the single-crystal piezoelectric film and the bottom electrode to enclose the bottom electrode, like in the process 100B. The second passivation layer may be the bottom passivation layer 122.

According to various non-limiting embodiments, the method may further include arranging an elastic layer over the single-crystal piezoelectric film, like in the process 300A. The elastic layer may be the elastic layer 208.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A semiconductor device comprising:
   a substrate wafer;
   a bonding layer at least partially covering a front surface of the substrate wafer;
   a plurality of silicon pillars bonded to the front surface of the substrate wafer by the bonding layer;
   a single-crystal piezoelectric film having a first surface and an opposing second surface, wherein the single-crystal piezoelectric film is supported by the plurality of silicon pillars such that the second surface of the piezoelectric film and the front surface of the substrate wafer enclose a cavity therebetween;
   a top electrode arranged adjacent to the first surface of the single-crystal piezoelectric film;
   a bottom electrode arranged adjacent to the second surface of the single-crystal piezoelectric film, wherein the bonding layer is disposed between each of the plurality of silicon pillars and the substrate wafer and sandwiched by the plurality of silicon pillars and the substrate wafer; and a via extending through the single-crystal piezoelectric film to expose the bottom electrode, wherein the top electrode, the bottom electrode and the via are disposed above and over the cavity, the cavity is between two adjacent pillars of the plurality silicon pillars.

2. The semiconductor device of claim 1, wherein each silicon pillar of the plurality of silicon pillars has side walls that are perpendicular to the front surface of the substrate wafer and wherein each silicon pillar is electrically isolated from adjacent silicon pillars by one or more air gaps.

3. The semiconductor device of claim 1, wherein the bonding layer comprises at least one of aluminum, germanium, or combinations thereof.

4. The semiconductor device of claim 1, further comprising:
a top passivation layer arranged adjacent to the first surface of the single-crystal piezoelectric film and enclosing the top electrode therein; and
a bottom passivation layer arranged adjacent to the second surface of the single-crystal piezoelectric film and enclosing the bottom electrode therein.

5. The semiconductor device of claim 4, wherein each of the top passivation layer and the bottom passivation layer comprises a material that is resistant to etching by sulfur hexafluoride.

6. The semiconductor device of claim 1, further comprising:
a metal cap at least partially anchored to the first surface of the single-crystal piezoelectric film where at least one point between the metal cap and the single-crystal piezoelectric film is unanchored, wherein the metal cap at least partially extends over at least one of the top electrode and the bottom electrode; and
a sealing layer disposed over the metal cap and the single-crystal piezoelectric film, such that the sealing layer seals a gap between an unanchored portion of the metal cap and the single-crystal piezoelectric film.

7. The semiconductor device of claim 6, wherein the metal cap and the bonding layer comprise the same material composition.

8. The semiconductor device of claim 1, wherein each of the top electrode and the bottom electrode comprises a plurality of finger members, wherein the plurality of finger members of the top electrode at least substantially overlap with the plurality of finger members of the bottom electrode.

9. The semiconductor device of claim 1, further comprising:
an interconnect member at least partially arranged over the first surface of the single-crystal piezoelectric film and extending down through a via in the single-crystal piezoelectric film to reach the bonding layer.

10. The semiconductor device of claim 9, wherein the interconnect member and the bonding layer comprise the same material composition.

11. The semiconductor device of claim 1, wherein at least one of the top electrode and the bottom electrode comprises segments of different thicknesses, wherein the single-crystal piezoelectric film comprises segments of different thicknesses.

12. The semiconductor device of claim 1, wherein each silicon pillar is electrically isolated from adjacent silicon pillars by one or more air gaps.

13. The semiconductor device of claim 1, further comprising:
an elastic layer arranged over the single-crystal piezoelectric film.

14. The semiconductor device of claim 1, wherein the top and bottom electrodes are disposed above the cavity and the bonding layer extends into the cavity.

15. The semiconductor device of claim 1, the semiconductor device further comprises another via extending through the single-crystal piezoelectric film and one of the plurality of silicon pillars to reach the bonding layer.

16. The semiconductor device of claim 1, wherein the top electrode overlaps the bottom electrode and wherein the top electrode and the bottom electrode each comprise at least one slit.

17. The semiconductor device of claim 1, the bonding layer comprises an alloy of a first bonding material and a second bonding material and the second bonding material extends into the cavity.

18. The semiconductor device of claim 17, wherein the first bonding material and the second bonding material are different metals that form a eutectic alloy.

19. A method of forming a semiconductor device, the method comprising:
at least partially covering a front surface of a substrate wafer with a bonding layer;
providing a second wafer comprising a single-crystal piezoelectric film having a first surface and an opposing second surface, a plurality of silicon pillars arranged over the second surface of the single-crystal piezoelectric film, and a bottom electrode arranged on the second surface of the single-crystal piezoelectric film;
bonding the second wafer to the substrate wafer such that the plurality of silicon pillars are bonded to the front surface of the substrate wafer with the bonding layer and a cavity is enclosed between the second surface of the piezoelectric film and the front surface of the substrate wafer; and
providing a top electrode adjacent to the first surface of the single-crystal piezoelectric film, wherein the bonding layer is disposed between each of the plurality of silicon pillars and the substrate wafer and sandwiched by the plurality of silicon pillars and the substrate wafer
providing a via extending through the single-crystal piezoelectric film to expose the bottom electrode, wherein the top electrode, the bottom electrode and the via are disposed above and over the cavity, the cavity is between two adjacent pillars of the plurality silicon pillars.

* * * * *